(12) United States Patent
Doris et al.

(10) Patent No.: US 10,998,854 B2
(45) Date of Patent: *May 4, 2021

(54) RESONANT CLOCK CIRCUIT WITH MAGNETIC SHIELD

(71) Applicant: INTERNATIONAL BUSINESS MACHINES CORPORATION, Armonk, NY (US)

(72) Inventors: Bruce B. Doris, Slingerlands, NY (US); Rajiv V. Joshi, Yorktown Heights, NY (US); Naigang Wang, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 213 days.

This patent is subject to a terminal disclaimer.

(21) Appl. No.: 15/612,532

(22) Filed: Jun. 2, 2017

(65) Prior Publication Data

US 2018/0351506 A1 Dec. 6, 2018

(51) Int. Cl.
*H03B 5/08* (2006.01)
*H03B 5/18* (2006.01)
*H03B 1/04* (2006.01)
*H03B 5/12* (2006.01)

(52) U.S. Cl.
CPC ............... *H03B 1/04* (2013.01); *H03B 5/08* (2013.01); *H03B 5/1228* (2013.01); *H03B 2201/0266* (2013.01)

(58) Field of Classification Search
CPC .......... H03B 1/04; H03B 5/08; H03B 5/1228; H03B 2201/0266

USPC ................ 331/117 R, 117 FE, 167
See application file for complete search history.

(56) References Cited

U.S. PATENT DOCUMENTS

| 5,831,331 | A  | * | 11/1998 | Lee ........................ | H01L 23/645 |
| | | | | | 257/659 |
| 7,323,948 | B2 | * | 1/2008  | Ding .................... | H01L 23/5223 |
| | | | | | 257/531 |
| 9,484,312 | B2 | * | 11/2016 | Lin ........................ | H01L 28/10 |
| 10,797,642| B2 | * | 10/2020 | Doris .................... | H03B 5/1228 |
| 2006/0220737 | A1 | | 10/2006 | Sanderson | |

(Continued)

FOREIGN PATENT DOCUMENTS

| CN | 103970182 | 8/2014 |
| CN | 105472873 | 4/2016 |

OTHER PUBLICATIONS

Restle, et al., "Wide-Frequency-Range Resonant Clock with On-the-Fly Mode Changing for the POWER8TM Microprocessor", International Solid-State Circuits Conference 2014, Feb. 2014, 3 pages.

(Continued)

*Primary Examiner* — Richard Tan
(74) *Attorney, Agent, or Firm* — Tutunjian & Bitetto, P.C.; Rabin Bhattacharya

(57) ABSTRACT

Semiconductor devices and methods relating to the semiconductor devices are provided. A semiconductor device includes a resonant clock circuit. The semiconductor device further includes an inductor. The semiconductor device also includes a magnetic layer formed of a magnetic material disposed in between a portion of the resonant clock circuit and the inductor. Clock signals of the resonant clock circuit are utilized by the magnetic layer.

14 Claims, 14 Drawing Sheets

(56) References Cited

U.S. PATENT DOCUMENTS

| | | | |
|---|---|---|---|
| 2006/0232348 A1 | 10/2006 | Hino | |
| 2010/0072572 A1* | 3/2010 | Baumgartner | H01L 28/40 257/531 |
| 2010/0244972 A1* | 9/2010 | Tanabe | H01F 17/0013 331/117 FE |
| 2010/0276791 A1 | 11/2010 | Kaneko et al. | |
| 2014/0167831 A1 | 6/2014 | Wu et al. | |
| 2014/0240021 A1 | 8/2014 | Hibbeler et al. | |
| 2015/0234422 A1 | 8/2015 | Bucelot et al. | |
| 2015/0235522 A1 | 8/2015 | De Waal et al. | |
| 2015/0302976 A1 | 10/2015 | Chang et al. | |
| 2018/0351507 A1* | 12/2018 | Doris | H03B 5/1228 |

OTHER PUBLICATIONS

International Search Report and Written Opinion dated Sep. 29, 2018 for International Application No. PCT/IB2018/053874, 9 pages.

Office Action dated Oct. 24, 2019 for U.S. Appl. No. 15/842,751, 35 pages.

Office Action dated Feb. 4, 2020 for U.S. Appl. No. 15/842,751, 15 pages.

* cited by examiner

RESONANT CLOCK CIRCUIT WITH MAGNETIC SHIELD

BACKGROUND

Technical Field

The present invention relates generally to clock circuits and, in particular, to a resonant clock circuit with a magnetic shield.

Description of the Related Art

Semiconductor devices having a resonant clock circuit can include buffers for buffering an input to the resonant clock circuit and can further include a clock distribution system to distribute clock signals conditioned by the resonant clock circuit to other circuits disposed throughout such semiconductor devices. The meshed clock distribution system can be a meshed clock distribution system that includes one or more clock meshes for clock distribution.

The use of a resonant clock circuit has been shown to reduce global clocking power and timing uncertainty. By resonating the large global clock capacitance with an inductance, the energy used to charge the clock node each period can be recycled within an LC resonant tank network of the resonant clock circuit, resulting in lower clock power.

Typically, such an arrangement as described above involves the use of multiple large capacitors, as well as multiple inductors. Moreover, the multiple inductors can be tuned at different frequencies, possible one or more orders of magnitude in difference from each other.

Accordingly, undesirable problems that can result from such an arrangement and that can adversely affect semiconductor device performance include, but are not limited to, the intrinsic capacitance of the resonant clock circuit elements (e.g., inductors) as well as the parasitic capacitance of the resonant clock circuit elements.

Additionally, the resonant clock circuit elements can be susceptible to electromagnetic interference (EMI) from external components.

Hence, there is a need for a resonant clock circuit that overcomes the aforementioned problems.

SUMMARY

According to an aspect of the present invention, a semiconductor device is provided. The semiconductor device includes a resonant clock circuit. The semiconductor device further includes an inductor. The semiconductor device also includes a magnetic layer formed of a magnetic material disposed in between a portion of the resonant clock circuit and the inductor. Clock signals of the resonant clock circuit are utilized by the magnetic layer. By having the magnetic layer in between the portion of the resonant clock circuit and the inductor, an area savings is realized compared to the prior art, while providing shielding to avoid undesirable effects such as EMI from external components.

Moreover, in an implementation relating to the aforementioned aspect, the magnetic material includes another inductor, and an intrinsic capacitance of the other inductor is used for storage. In this way, further features/capabilities (i.e., storage) can be realized.

Also, in an implementation relating to the aforementioned aspect, the clock signals of the resonant clock circuit can be utilized by the magnetic layer to reduce an effect of a parasitic capacitance of the resonant clock circuit element. In this way, overall circuit performance is improved.

Additionally, in an implementation relating to the aforementioned aspect, the clock signals of the resonant clock circuit are utilized by the magnetic layer to reduce an effect of an intrinsic capacitance of the resonant clock circuit element. In this way, overall circuit performance is improved.

According to another aspect of the present invention, a method is provided. The method includes arranging a magnetic layer in between an inductor and a portion of a resonant clock circuit element of a resonant clock circuit in a semiconductor device. Clock signals of the resonant clock circuit are utilized by the magnetic layer. Similar to the aforementioned semiconductor device, by having the magnetic layer in between the portion of the resonant clock circuit and the inductor, an area savings is realized compared to the prior art, while providing shielding to avoid undesirable effects such as EMI from external components.

According to yet another aspect of the present invention, a semiconductor device is provided. The semiconductor device includes a resonant clock circuit having a resonant clock circuit element. The semiconductor device further includes a magnetic layer formed of a magnetic material disposed above a portion of the resonant clock circuit. Clock signals of the resonant clock circuit are utilized by the magnetic layer. By having the magnetic layer above a portion of the resonant clock circuit, an area savings is realized compared to the prior art, while providing shielding to avoid undesirable effects such as EMI from external components.

According to still another aspect of the present invention, a semiconductor device is provided. The semiconductor device includes a resonant clock circuit having a resonant clock circuit element. The semiconductor device further includes a magnetic layer formed of a magnetic material disposed below a portion of the resonant clock circuit. Clock signals of the resonant clock circuit are utilized by the magnetic layer. By having the magnetic layer below a portion of the resonant clock circuit, an area savings is realized compared to the prior art, while providing shielding to avoid undesirable effects such as EMI from external components.

According to a further aspect of the present invention, a method is provided. The method includes arranging a magnetic layer below a portion of a resonant clock circuit element of a resonant clock circuit in a semiconductor device. Clock signals of the resonant clock circuit are utilized by the magnetic layer. Similar to the aforementioned semiconductor device, by having the magnetic layer below a portion of the resonant clock circuit, an area savings is realized compared to the prior art, while providing shielding to avoid undesirable effects such as EMI from external components.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The present invention is directed to a resonant clock circuit with a magnetic shield.

Figure 1:
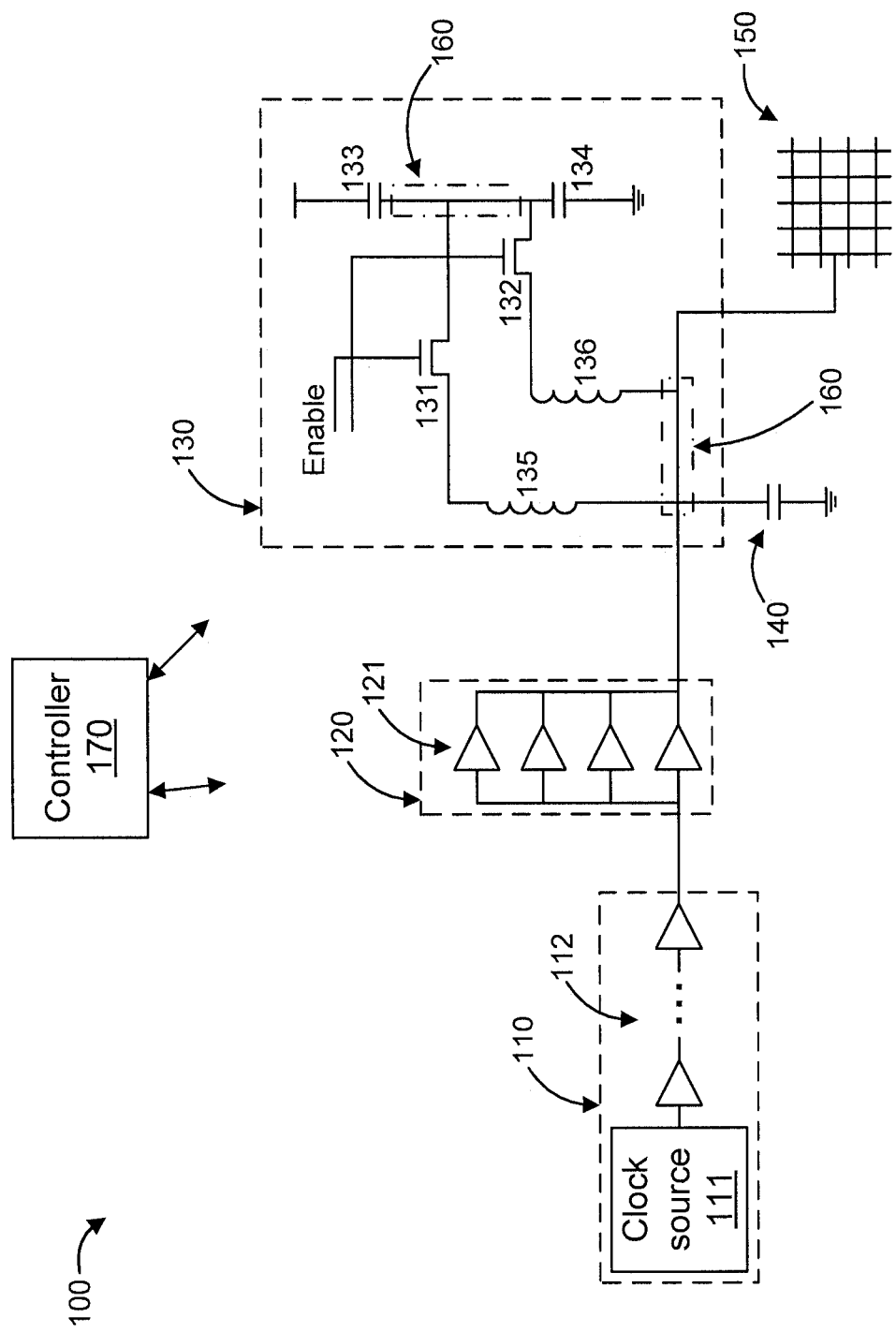
FIG. 1 shows a schematic diagram for an exemplary semiconductor device, in accordance with an embodiment of the present invention.

FIG. 1 shows a schematic diagram for an exemplary semiconductor device 100, in accordance with an embodiment of the present invention.

The semiconductor device 100 includes an input stage 110, a programmable buffers stage 120, a resonant clock circuit (also interchangeably referred to herein as "resonant structure") 130, a mesh capacitor 140, a clock mesh 150, and magnetic material 160. In FIG. 1, the magnetic material 160 is shown semi-transparent for the sakes of illustration and clarity, in order to avoid obscuring the underlying components and connections. The semiconductor device 100 can also include a controller 170.

An output of the input stage 110 is connected to an input of the programmable buffers stage 120. An output of the programmable buffers state 120 is connected to an input of the resonant clock circuit 130. An output of the resonant clock circuit is connected to an input of the clock mesh 150. The clock mesh 150 includes a plurality of clock signal lines for providing clock signals to various portions/elements of the semiconductor device 100.

The input stage 110 can include a clock source 111 (e.g., a Phase Locked Loop (PLL)), and a set of clock buffers 112. The set of clock buffers 112 receive a global clock signal from the clock source 111. The buffers in the set of clock buffers 112 are arranged in a series configuration.

The programmable buffers stage 120 includes a set of programmable buffers 121. In an embodiment, the programmable buffers 121 can have varying resistance that is controlled by the controller 170. The buffers in the set of programmable buffers 121 are arranged in a parallel configuration.

The resonant clock circuit 130 can include a Metal-Oxide-Semiconductor Field-Effects Transistor (MOSFET) 131, a MOSFET 132, a capacitor 133, a capacitor 134, an inductor 135, and an inductor 136. The capacitors 133 and 134 and the inductors 135 and 136 can be considered (and are interchangeably referred to as) "resonant clock circuit elements". The capacitors 133 and 134 and the inductors 135 and 136 form an LC resonant tank network 139. In an embodiment, the capacitors 133 and 134 can be large capacitors.

The MOSFETS 131 and 132 are used to provide resonant enable/disable signals to the resonant clock circuit 130 to enable/disable the resonant clock circuit 130 and/or selective modes (e.g., one or more resonant modes (e.g., a low frequency resonant mode, a high frequency resonant mode, etc.) and a non-resonant mode) of the resonant clock circuit 130. In an embodiment, at least one of the resonant clock circuit elements (e.g., inductor 135) is tuned at a frequency at least one order of magnitude greater than a frequency at which at least one other one of the resonant clock circuit elements (e.g., inductor 136) is tuned, in order to provide a wide-frequency operating range (e.g., from low to high) for the resonant clock circuit 130. A high frequency resonant clock mode is presumed to involve less clock power than a low frequency resonant clock mode (as voltage is scaled with frequency). In an embodiment, the high frequency resonant clock mode can be used to save power from 2.5 GHz>5 GHz. Of course, other ranges can also be used, depending upon the selected components involved, as readily appreciated by one of ordinary skill in the art.

In an embodiment, the resonant clock circuit 130 provides a non-resonant mode (e.g., with MOSFETS 131 and 132 being open), a low frequency resonant mode (e.g., with one of MOSFETS 131 and 132 being closed), and a high frequency resonant mode (e.g., with both of MOSFETS 131 and 132 being closed). Of course, other switch configurations (e.g., involving different numbers of switches than those shown, and/or involving different numbers of switches being open or closes, etc.) for mode switching can also be used. These and other variations of the resonant clock circuit 130 are readily determined by one of ordinary skill in the art given the teachings of the present invention provided herein, while maintaining the spirit of the present invention.

The resonant clock circuit 130 resonates the large capacitance of the global clock with an inductance so that the energy used to charge the clock node each period is recycled within the LC resonant tank network 139 of the resonant clock circuit 130, resulting in lower clock power.

The mesh capacitor 140 is connected to an output of the resonant clock circuit 130 and is used to establish a DC voltage approximately at which the clock mesh 150 operates.

The clock mesh 150 includes one or more clock grids 151 for local distribution of clock signals.

The magnetic material 160 is disposed above one or more portions of the resonant clock circuit 130. For example, the magnetic material can be disposed above conducting material (e.g., above electrically conductive lines in a Back End Of Line (BEOL) layer) that interconnect the resonant clock circuit elements and/or can be disposed (in a BEOL layer) above the resonant clock circuit elements themselves. The magnetic material 160 can be considered to form a magnetic shield in the semiconductor device 100.

In the example of FIG. 1, the magnetic material 160 is disposed above at least a portion of conducting material connecting the capacitors 133 and 134. Moreover, in the example of FIG. 1, the magnetic material 160 is disposed above at least a portion of conducting material connecting the inductors 135 and 136.

The magnetic material 160 can be formed from any material and/or circuit element having magnetic properties including, but not limited to, an inductor, and so forth. In an embodiment, the magnetic material 160 can be formed from an inductor (e.g., but not limited to a coiled inductor). The inductor can be used to store electrical energy. The stored electrical charge can be used to compensate for undesirable effects such as parasitic capacitance and/or intrinsic capacitance of the inductors 135 and 136.

In an embodiment, a barrier material can be included between the magnetic material 160 and the underlying devices above which the magnetic material 160 is disposed. Preferably, the barrier material physically separates the magnetic material 160 from the underlying devices and permits utilization of fields relating to current and magnetism by the magnetic material 160.

In an embodiment, a barrier material can included between the portions of magnetic material 160 on a magnetic material layer 161 in order to separate the portions of magnetic material 160 on a same layer (i.e., the magnetic material layer 161). In such a case, the magnetic material layer 161 would be a discontinuous layer in the BEOL disposed over a portion of the resonant clock circuit 130.

The controller 170 is an on-chip controller that can be configured to (e.g., finely or at any desired granularity) vary buffer strength (of the buffers, e.g., buffers 121) and switch resistance (of the switches, e.g., MOSFETs 131 and 132) of the semiconductor device 100 in order to achieve on-the-fly mode changing.

It is to be appreciated that while one each of the input stage 110, the programmable buffer stage 120, the resonant clock circuit 130, the mesh capacitor 140, and the clock mesh 150 of the semiconductor 100 are shown in the embodiment of FIG. 1 for the sake of illustration, in other embodiments one or more of any of these elements can be used depending upon the implementation, as readily appreciated by one of ordinary skill in the art given the teachings of the present invention provided herein.

Further, it is to be appreciated that while MOSFETS are shown in the embodiment of FIG. 1, other switching elements can also be used, while maintaining the spirit of the present invention.

Moreover, it is to be appreciated that the elements shown in FIG. 1 can pertain to a three-dimensional stacked chip that includes two or more electronic integrated circuit chips (referred to as strata or stratum) stacked one on top of the other. The strata can be connected to each other with inter-strata interconnects that could use C4 or other technology, and the strata could use through-Silicon vias (TSVs) to connect from the front side to the back side of the strata. The strata could be stacked face-to-face or face-to-back where the active electronics can be on any of the "face" or "back" sides of a particular stratum.

While not shown, other embodiments can involve the use of sector buffers and multiplexers. The sector buffers can be used to drive multiple sectors of the semiconductor device, each having one or more respective clock meshes. The multiplexers can be used to select various sectors to which clock signals are provided.

These and other variations of the semiconductor device 100 are readily determined by one of ordinary skill in the art given the teachings of the present invention provided herein, while maintaining the spirit of the present invention.

It is to be appreciated that the incorporation of the magnetic material 160 into the semiconductor device 100 of FIG. 1 can reduce the effects of parasitic capacitance and intrinsic capacitance of resonant clock circuit elements such as inductors, thus improving overall performance of the semiconductor device 100. Moreover, the semiconductor device 100 of FIG. 1 reduces an amount of area(s) needed to implement the inductors, thus further resulting in an improved semiconductor device 100. Additionally, the magnetic material 160 can serve as a magnetic shield to mitigate or eliminate the effects of EMI on device performance. These and other advantages of the present invention are readily ascertained by one of ordinary skill in the art given the teachings of the present invention provided herein.

Figure 2:
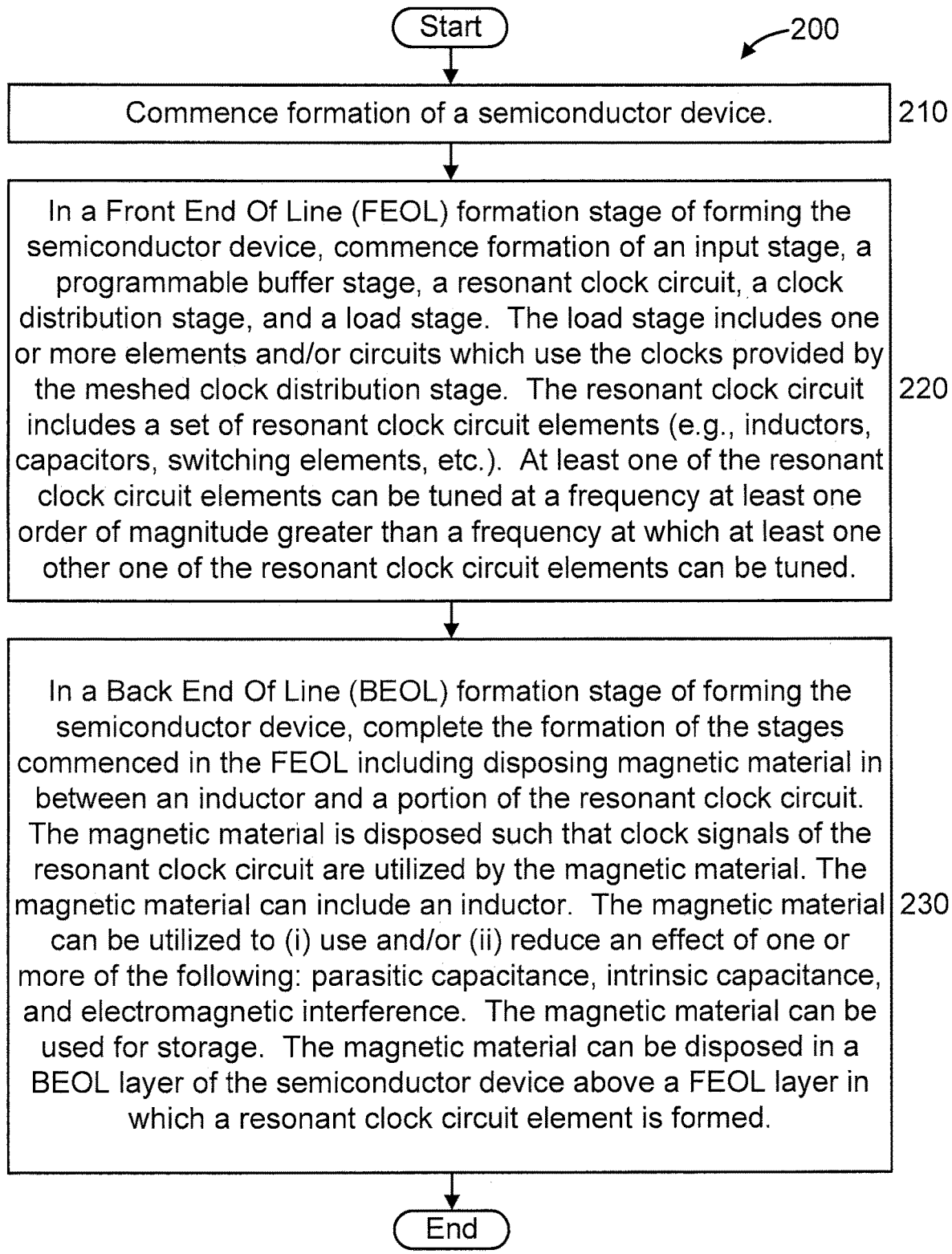
FIG. 2 shows a flow diagram for an exemplary method for forming a semiconductor device, in accordance with an embodiment of the present invention.

FIG. 2 shows a flow diagram for an exemplary method 200 for forming a semiconductor device (such as semiconductor device 100 of FIG. 1), in accordance with an embodiment of the present invention.

At step 210, commence formation of a semiconductor device. As readily appreciated by one of ordinary skill in the art, step 210 can involve formation of a substrate, and so forth.

At step 220, in a Front End Of Line (FEOL) formation stage of forming the semiconductor device, commence formation of an input stage, a programmable buffer stage, a resonant clock circuit, a clock distribution stage (e.g., having one or more clock meshes for local clock distribution in the semiconductor device), and a load stage. The load stage includes one or more elements and/or circuits which use the clocks provided by the meshed clock distribution stage. The resonant clock circuit includes a set of resonant clock circuit elements. The set of resonant clock circuit elements can include, e.g., inductors (e.g., coiled inductors) and capacitors. The resonant clock circuit can also include switching elements (e.g., MOSFETs, etc.) for enabling and disabling the resonant clock circuit and/or modes thereof. In an embodiment, at least one of the resonant clock circuit elements can be tuned at a frequency at least one order of magnitude greater than a frequency at which at least one other one of the resonant clock circuit elements can be tuned. Such varied tuning supports different resonant clock modes (e.g., a high frequency resonant clock mode and a low frequency resonant clock mode).

At step 230, in a Back End Of Line (BEOL) formation stage of forming the semiconductor device, complete the formation of the stages commenced in the FEOL formation stage including disposing magnetic material in between an inductor and a portion of the resonant clock circuit. The magnetic material is disposed such that clock signals of the resonant clock circuit are utilized by the magnetic material. It is to be appreciated that any material having magnetic properties can be used as the magnetic material. In an embodiment, the magnetic material can include an inductor (e.g., a coiled inductor).

In an embodiment, the intrinsic capacitance of the magnetic material (e.g., implemented as an inductor) can be used for storage. For example, electrical energy can be stored in a magnetic field of the magnetic material (e.g., implemented as an inductor). In an embodiment, the magnetic material can use a parasitic capacitance of one or more of the resonant clock circuit elements for operating the resonant clock circuit.

In an embodiment, the magnetic material can be used to reduce an effect (e.g., increased clock power) of a parasitic capacitance of one or more of the resonant clock circuit elements. In an embodiment, the magnetic material can be used to reduce an effect (e.g., increased clock power) of an intrinsic capacitance of one or more of the resonant clock circuit elements.

In an embodiment, the magnetic material can be used to reduce an effect of (e.g., external) electromagnetic interference on the semiconductor device.

In an embodiment, the magnetic material can be disposed in a BEOL layer of the semiconductor device above a FEOL layer in which a resonant clock circuit element is formed.

In an embodiment, the portion of the resonant circuit above which the magnetic material is disposed includes a top layer of the resonant clock circuit.

In an embodiment, the magnetic material can be disposed above the resonant clock circuit element.

In an embodiment, the magnetic material can be disposed on the resonant clock circuit element.

In an embodiment, the magnetic material can be disposed over conducting materials connecting two or more elements of the resonant clock circuit.

It is to be appreciated that the resonant clock circuit with magnetic shield can be used for applications including, but not limited to, microprocessors (with or without on-board cache), low power machine learning accelerators, low frequency Internet of Things, and so forth. These and other applications to which the present invention can be applied are readily determined by one of ordinary skill given the teachings of the present invention provided herein, while maintaining the spirit of the present invention.

Figure 3:
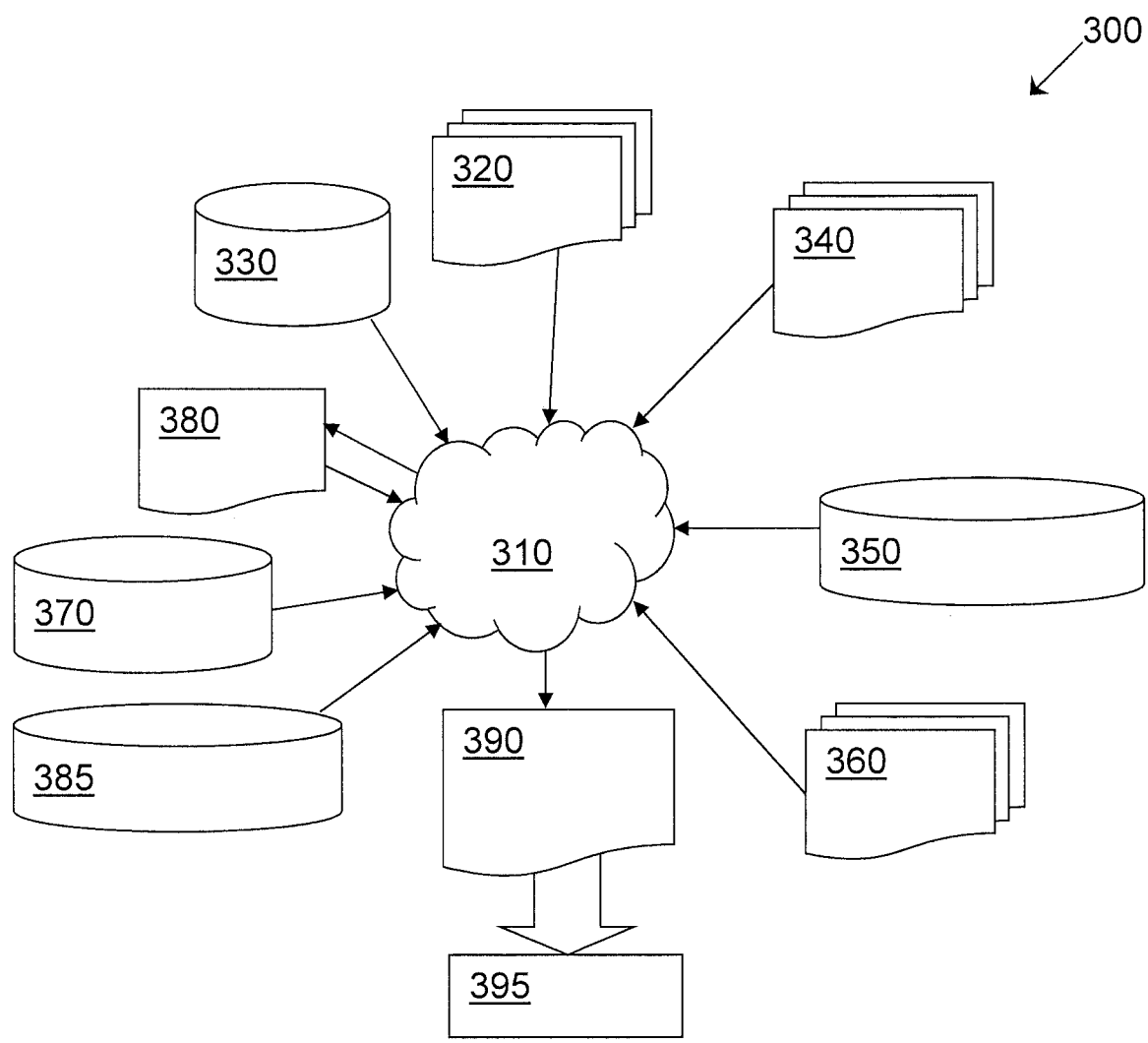
FIG. 3 shows a block diagram of an exemplary design flow used for example, in semiconductor IC logic design, simulation, test, layout, and manufacture, in accordance with an embodiment of the present invention.

FIG. 3 shows a block diagram of an exemplary design flow 300 used for example, in semiconductor IC logic design, simulation, test, layout, and manufacture, in accordance with an embodiment of the present invention. Design flow 300 includes processes, machines and/or mechanisms for processing design structures or devices to generate logically or otherwise functionally equivalent representations of the design structures and/or devices described above and shown in FIG. 1. The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera Inc. or Xilinx, Inc.

FIG. 3 illustrates multiple such design structures including an input design structure 320 that is preferably processed by a design process 310. Input design structure 320 may be a logical simulation design structure generated and processed by design process 310 to produce a logically equivalent functional representation of a hardware device. Input design structure 320 may also or alternatively comprise data and/or program instructions that when processed by design process 310, generate a functional representation of the physical structure of a hardware device. Whether representing functional and/or structural design features, input design structure 320 may be generated using electronic computer-aided design (ECAD) such as implemented by a core developer/designer. When encoded on a machine-readable data transmission, gate array, or storage medium, input design structure 320 may be accessed and processed by one or more hardware and/or software modules within design process 310 to simulate or otherwise functionally represent an electronic component, circuit, electronic or logic module, apparatus, device, or system such as those shown in FIGS. 1 and 4-16. As such, input design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or logic structures shown in FIGS. 1 and 4-16 to generate a Netlist 380 which may contain design structures such as input design structure 320. Netlist 380 may comprise, for example, compiled or otherwise processed data structures representing a list of wires, discrete components, logic gates, control circuits, 310 devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 1070, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 310 without deviating from the scope and spirit of the invention. Design process 310 may also include modules for performing standard circuit design processes such as timing analysis, verification, design rule checking, place and route operations, etc.

Design process 310 employs and incorporates logic and physical design tools such as HDL compilers and simulation model build tools to process input design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to input design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 and 4-16. In one embodiment, design structure 390 may comprise a compiled, executable HDL simulation model that functionally simulates the devices shown in FIGS. 1 and 4-16.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1 and 4-16. Design structure 390 may then proceed to a stage 395 where, for example, design structure 390: proceeds to tape-out, is released to manufacturing, is released to a mask house, is sent to another design house, is sent back to the customer, etc.

FIGS. 4-15 show an exemplary method 400 for forming a resonant clock circuit with a magnetic shield, in accordance with an embodiment of the present invention. Regarding method 400, certain materials have been specified for the sake of illustration. However, it is to be appreciated that the present invention is not limited to solely the mentioned materials and, thus, other materials can also be used, as readily appreciated by one of ordinary skill in the art given the teachings of the present invention provided herein, while maintaining the spirit of the present invention. Moreover, while FIGS. 4-15 show the magnetic shield above the resonant clock circuit, FIG. 16 shows an embodiment of the present invention, with the magnetic shield below the resonant clock circuit.

Figure 4:
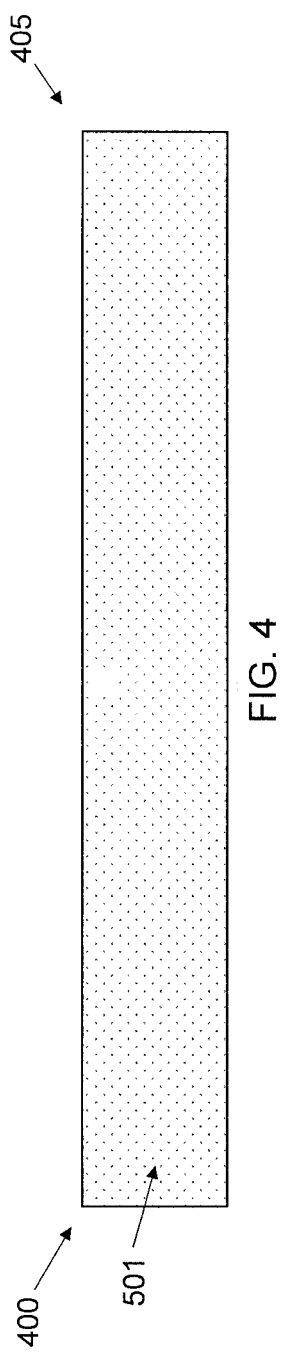
FIGS. 4-15 show an exemplary method 400 for forming a resonant clock circuit with a magnetic shield, in accordance with an embodiment of the present invention

Referring to FIG. 4, at step 405, provide a wafer substrate 501.

Figure 5:
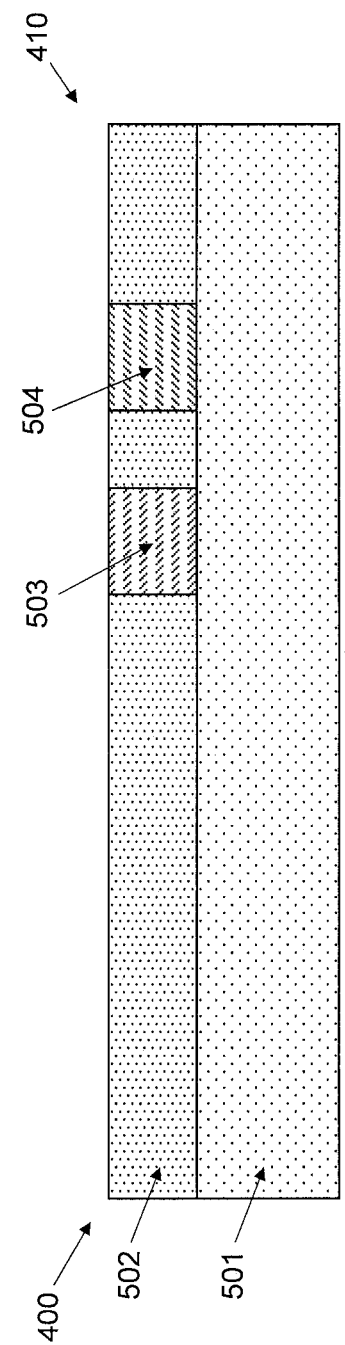

Referring to FIG. 5, at step 410, form Front End Of Line (FEOL)/Back End Of Line (BEOL) layers 502 for circuits and form a non-resonant clock circuit 503 and a resonant clock circuit 504 within the FEOL/BEOL layers 502.

Figure 6:
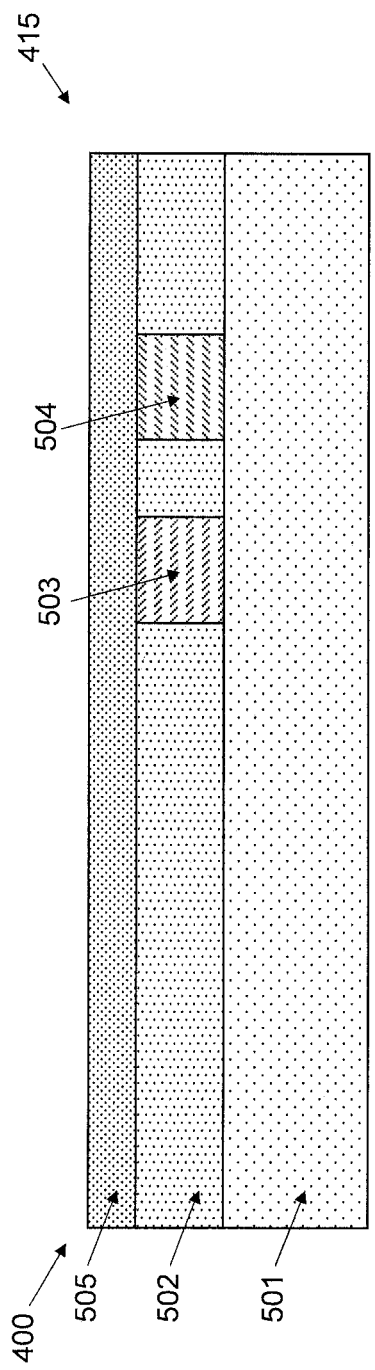

Referring to FIG. 6, at step 415, process the sequence to add a magnetic shield. In an embodiment, step 415 can involve, for example, adding a layer of low k or a SiO$_2$ dielectric 505.

Figure 7:
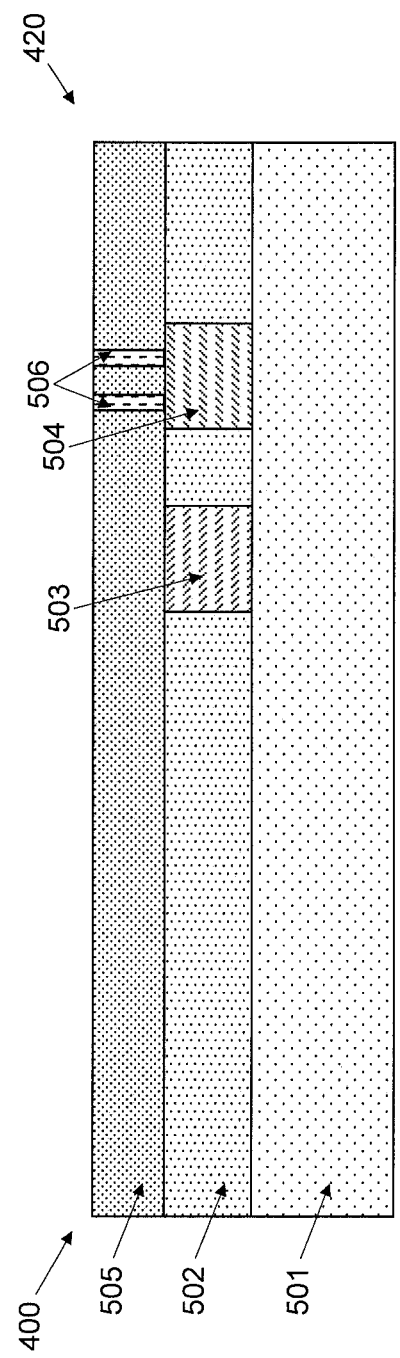

Referring to FIG. 7, at step 420, continue processing the sequence to add a magnetic inductor. In an embodiment, step 420 can involve, for example, forming vias 506 by conventional photolithography, etching and metallization, and chemical mechanical polishing. In an embodiment relating to step 420, the vias 506 pass through the shield and connect to inductor wires.

Figure 8:
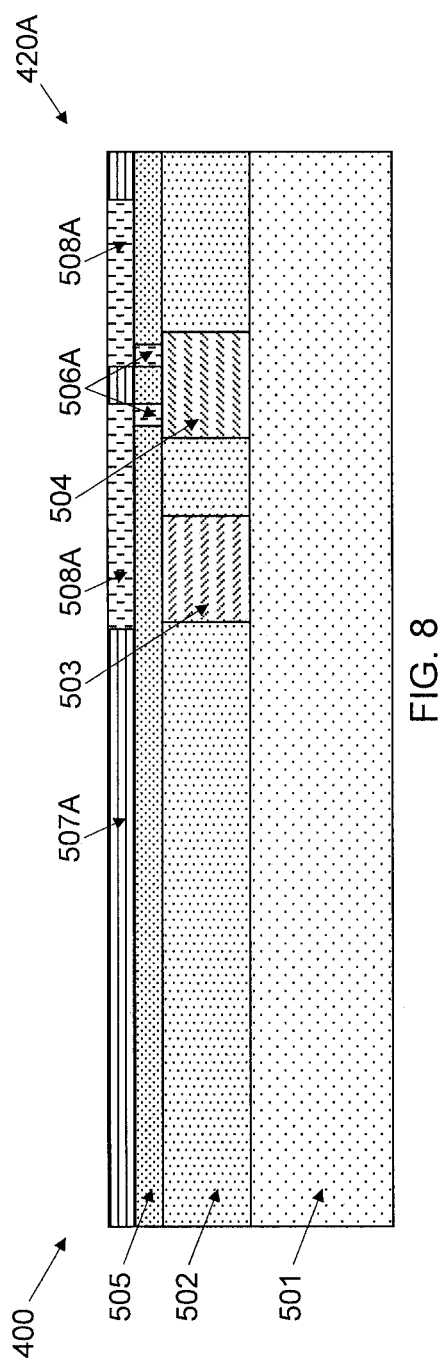

Referring to FIG. 8 which pertains to an alternate embodiment with respect to step 420 and FIG. 7, at step 420A, continue processing the sequence to add a magnetic inductor. In an embodiment, step 420A can involve, for example, depositing a dielectric 507A and then form wires 508A by conventional photolithography, etching and metallization, and chemical mechanical polishing.

Figure 9:
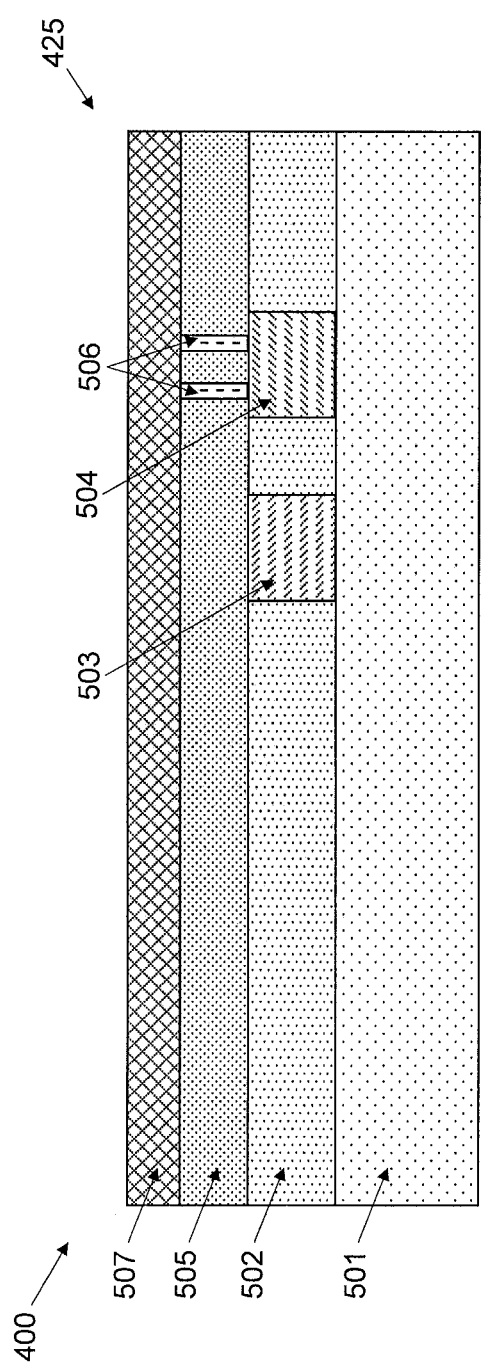

Referring to FIG. 9 (and continuing with the embodiment relating to FIG. 7), at step 425, continue processing the sequence to add a magnetic inductor. In an embodiment, step 425 can involve, for example, depositing a dielectric 507.

Figure 10:
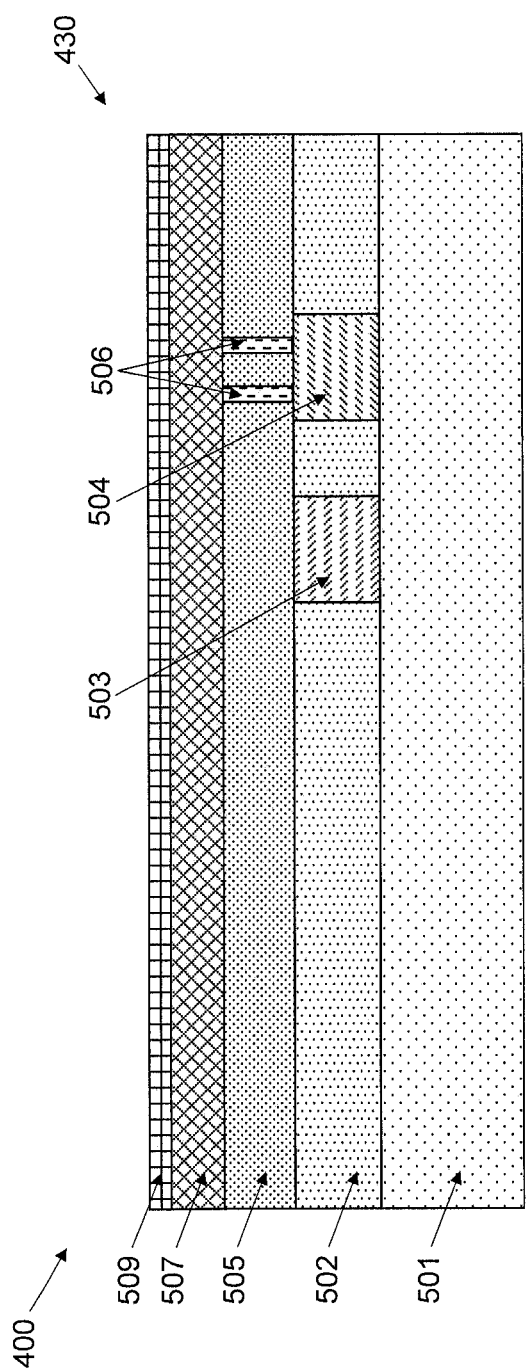

Referring to FIG. 10, at step 430, continue processing the sequence to add a magnetic inductor. In an embodiment, step 430 can involve, for example, depositing a magnetic material 509 to fabricate the magnetic shield. In an embodiment, the magnetic material 509 is composed of Cobalt (Co) that includes magnetic material FeTaN and/or FeNi and/or FeAlO and/or any combination thereof.

Figure 11:
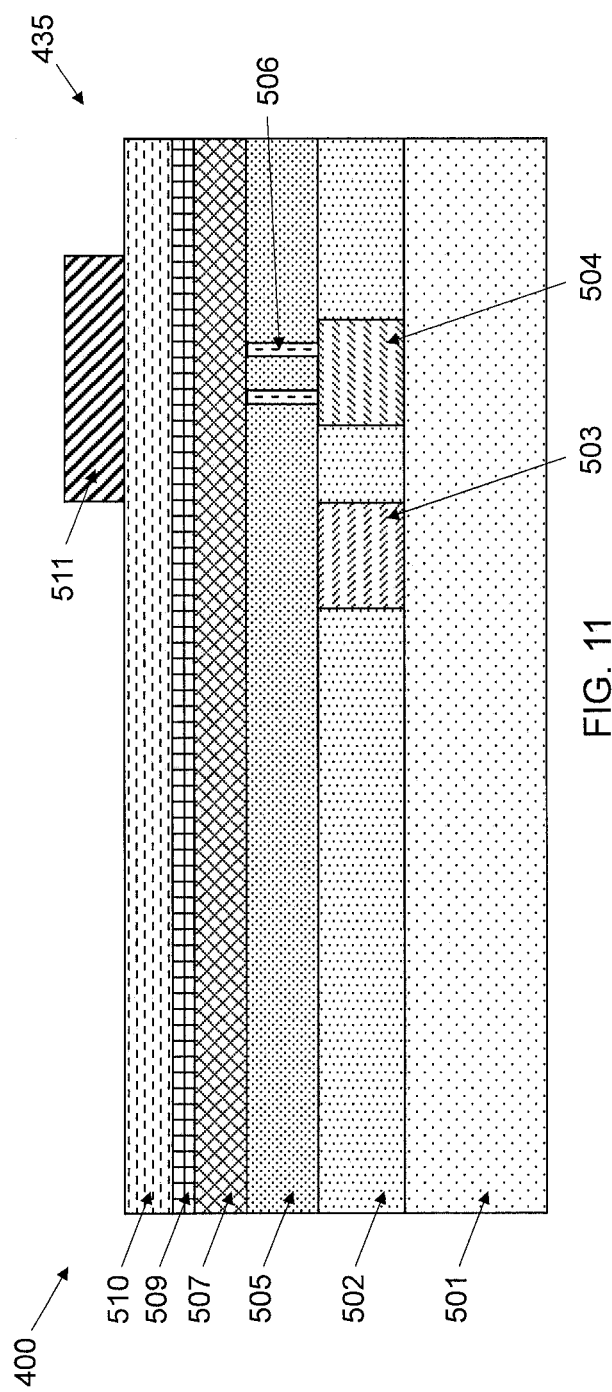

Referring to FIG. 11, at step 435, continue processing the sequence to add a magnetic inductor. In an embodiment, step 435 can involve, for example, patterning the magnetic material 509. In an embodiment, the patterning of the magnetic material can involve, for example, using an oxide hard mask 510 and a photolithography process to form resist images 511 to define the shield (from the magnetic material 509).

Figure 12:
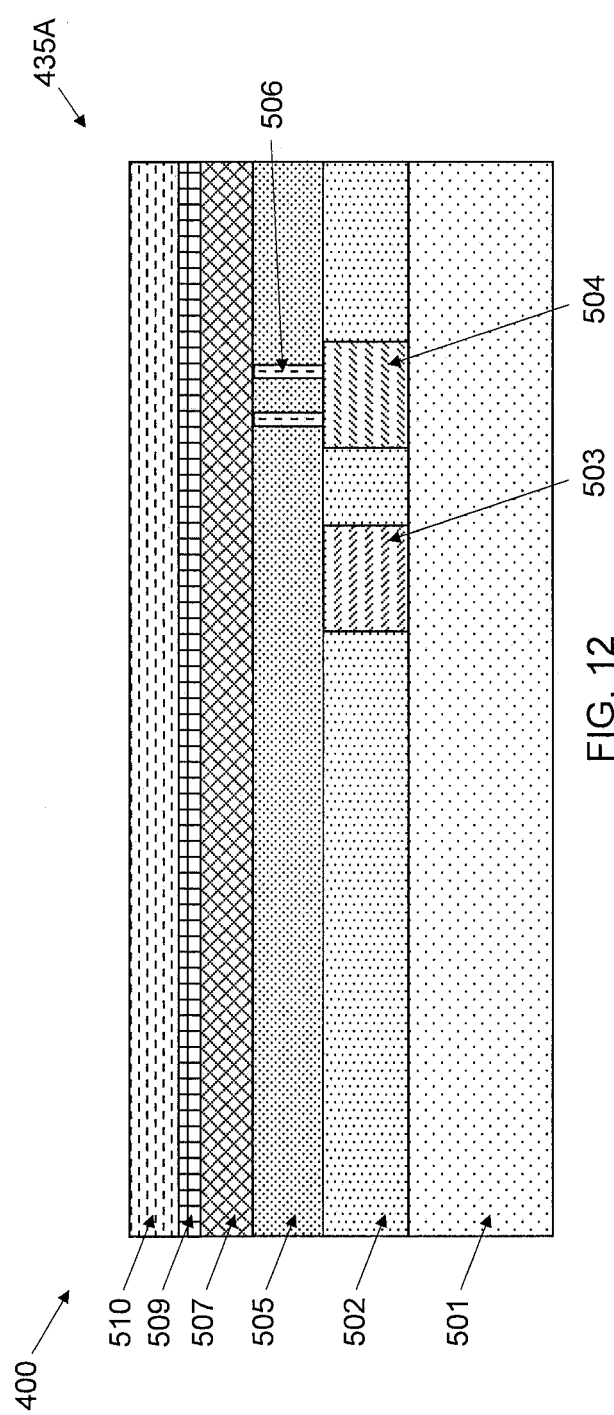
Figure 14:
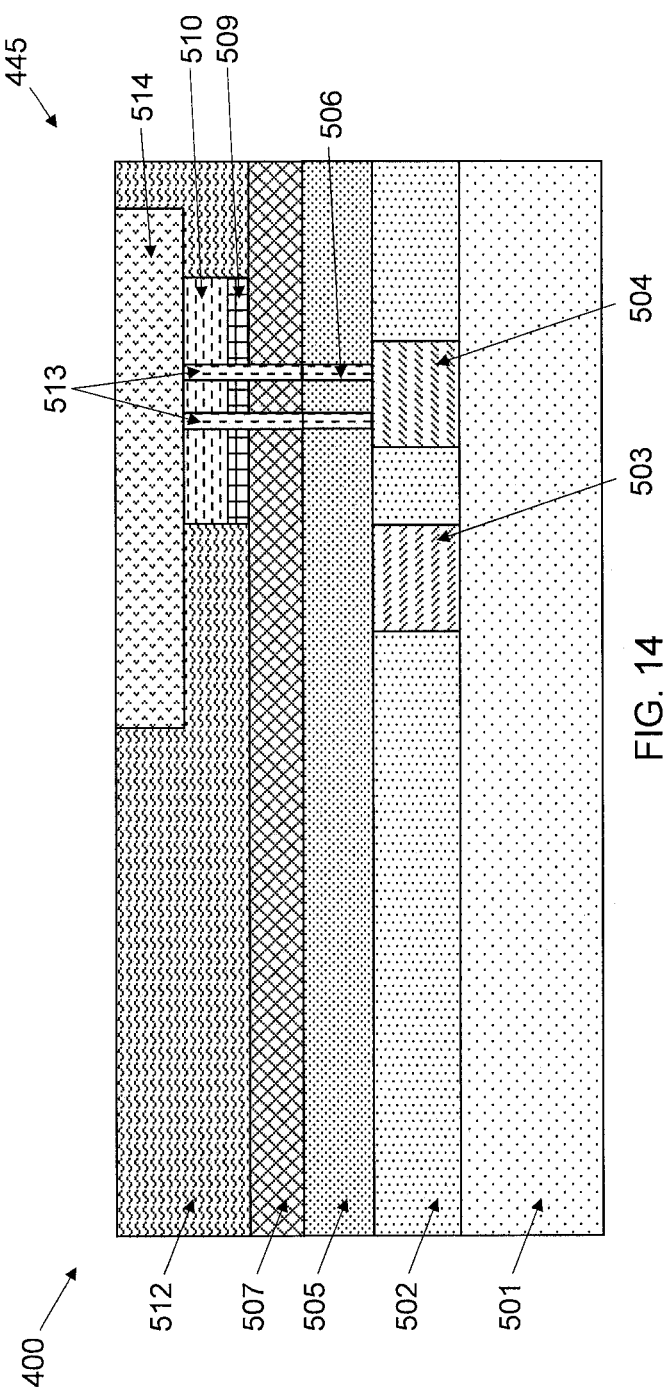

Referring to FIG. 12 which pertains to an alternate embodiment with respect to step 435 and FIG. 11, at step 435A, continue processing the sequence to add a magnetic inductor. In the embodiment of FIG. 14, the shield remains continuous (thus, the resist image 511 is not used).

Figure 13:
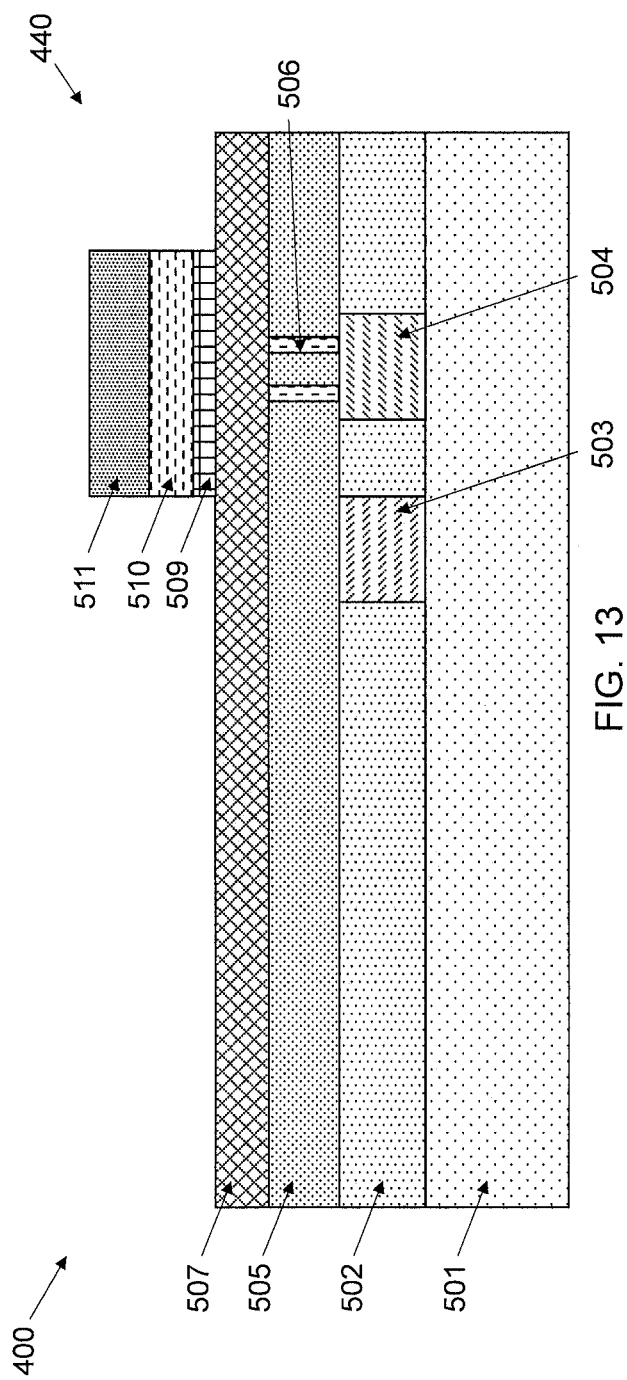

Referring to FIG. 13, at step 440, continue processing the sequence to add a magnetic inductor. In an embodiment, step 440 can involve, for example, further patterning the magnetic material. In an embodiment, the further patterning of the magnetic material can involve, for example, further using a photolithography process and the resist image 511.

Referring to FIG. 14, at step 445, continue processing the sequence to add a magnetic inductor. In an embodiment, step 445 can involve, for example, removing the resist image 511 (e.g., using a solvent strip), depositing a dielectric 512, and performing photolithography and etching to form vias 513 and a trench or space 514 for the inductor.

Figure 15:
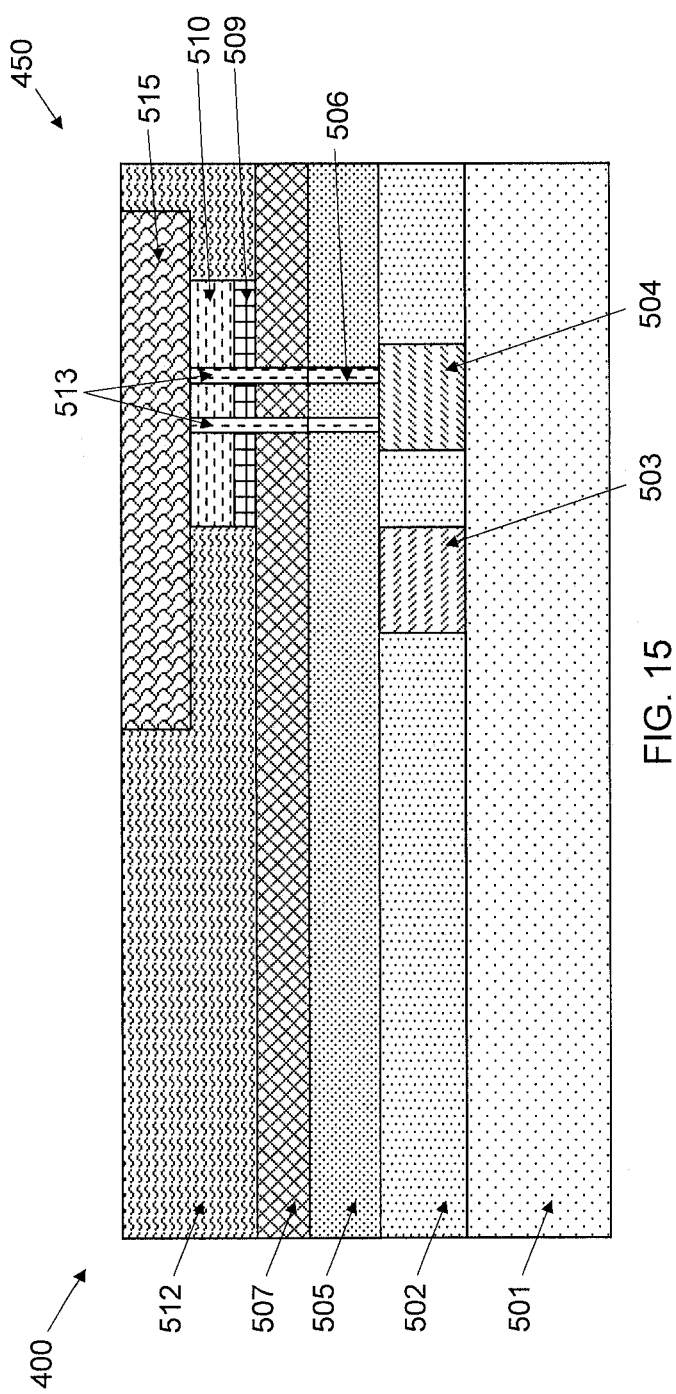
Figure 16:
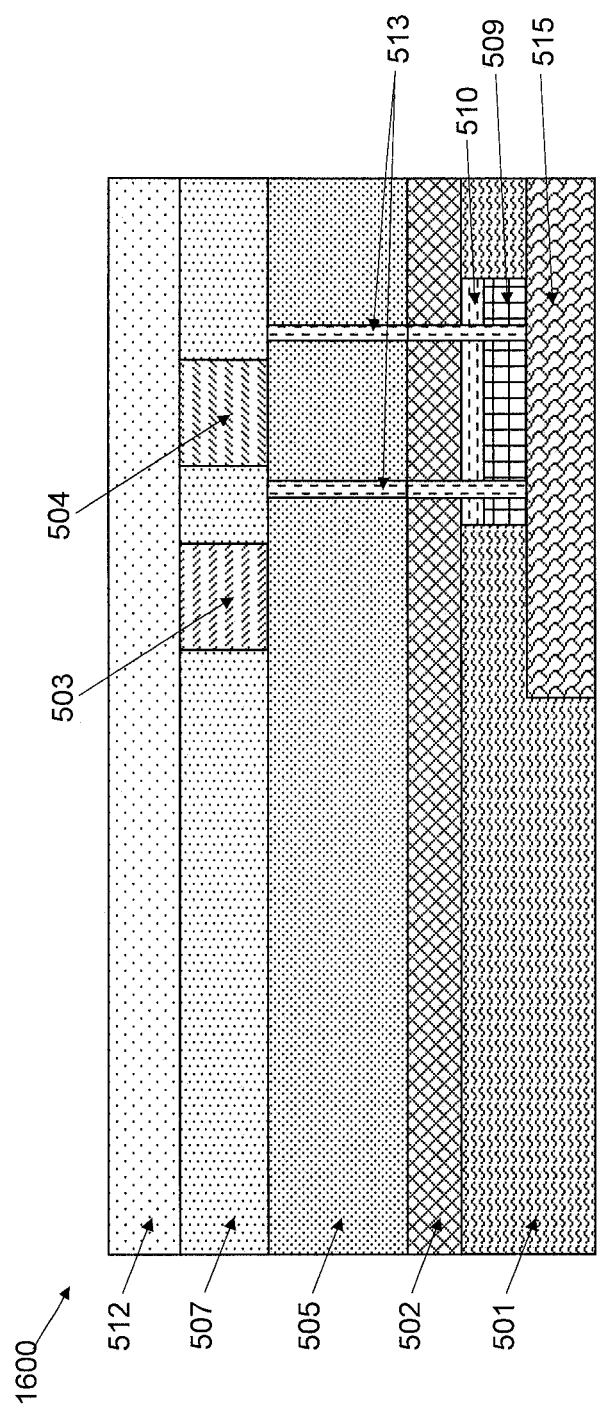
FIG. 16 shows an exemplary a resonant clock circuit with a magnetic shield underneath, in accordance with an embodiment of the present invention.

Referring to FIG. 15, at step 450, continue processing the sequence to add a magnetic inductor. In an embodiment, step 450 can involve, for example, adding metalization to form the inductor 515. After step 450, the final structure has a shield covering the (resonant and non-resonant) clock circuits, and enables the inductor 515 to be formed on top of the clock circuits, thus enabling area savings compared to the prior art.

Referring to FIG. 16, an exemplary semiconductor device 1600 is shown having a resonant clock circuit with a magnetic shield underneath, in accordance with an embodiment of the present invention. The same figure reference numerals from FIGS. 4-15 apply to the elements depicted in FIG. 16, emphasizing that the different between the structures in FIGS. 15 and 16 is the magnetic shield over versus under the resonant circuit, respectively.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
   forming a first resonant clock circuit having a first inductor and a first capacitor;
   forming a second resonant clock circuit having a second inductor and a second capacitor electrically connected to the first resonant clock circuit by first and second conducting materials, respectively; and
   forming a first magnetic layer and a second magnetic layer,
   wherein the first and second magnetic layers are disposed above the first and second conducting materials, respectively, to use a parasitic capacitance of at least one of the first and second resonant clock circuits to operate at least one of the first and second resonant clock circuits.

2. The method of claim 1, further comprising forming at least one of the first inductor and the second inductor in a Front End Of Line layer of the semiconductor device.

3. The method of claim 2, wherein magnetic material forming at least one of the first and second magnetic layers is disposed in a Back End Of Line layer of the semiconductor device above the Front End Of Line layer in which at least one of the first and second inductors is formed.

4. The method of claim 1, wherein the portion of the first resonant circuit above which magnetic material is disposed comprises a top layer of the first resonant clock circuit, wherein the magnetic material forms the first magnetic layer.

5. The method of claim 1, wherein magnetic material forming at least one of the first and second magnetic layers is disposed above a resonant clock circuit element.

6. The method of claim 1, wherein magnetic material forming at least one of the first and second magnetic layers is disposed under a resonant clock circuit element.

7. The method of claim 1, wherein magnetic material forming at least one of the first and second magnetic layers is disposed on a resonant clock circuit element.

8. The method of claim 1, wherein magnetic material forming at least one of the first and second magnetic layers is disposed in a Back End Of Line layer of the semiconductor device.

9. The method of claim 1, wherein magnetic material comprises forming at least one of the first and second magnetic layers another inductor.

10. The method of claim 9, further comprising using an intrinsic capacitance of the other inductor for storage.

11. The method of claim 1, wherein a resonant clock circuit element is proximate to another resonant clock circuit element, and magnetic material forming at least one of the first and second magnetic layers is disposed above at least a portion of at least one of the first and second conducting materials.

12. The method of claim 11, further comprising tuning a resonant clock circuit element at a frequency at least one order of magnitude greater than a frequency at which another resonant clock circuit element is tuned.

13. The method of claim 1, wherein at least one of the first resonant clock circuit and the second resonant clock circuit further comprises a set of buffers, coupled to a resonant clock circuit element, and wherein the magnetic material is disposed above at least a portion of a conducting material connecting the set of buffers to the resonant clock circuit element.

14. A method for forming a semiconductor device, comprising:
    forming a first resonant clock circuit having first and second resonant clock circuit elements;
    forming a second resonant clock circuit having third and fourth resonant clock circuit elements electrically connected to the first and second resonant clock circuit elements by first and second conducting materials, respectively; and
    forming a first magnetic layer and a second magnetic layer,
    wherein the first and second magnetic layers are disposed above the first and second conducting materials to use a parasitic capacitance of at least one of the first and second resonant clock circuits to operate at least one of the first and second resonant clock circuits.

* * * * *